United States Patent
Tanabe

(10) Patent No.: US 9,538,639 B2
(45) Date of Patent: Jan. 3, 2017

(54) WIRED CIRCUIT BOARD AND PRODUCING METHOD THEREOF

(71) Applicant: NITTO DENKO CORPORATION, Osaka (JP)

(72) Inventor: Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/619,508

(22) Filed: Feb. 11, 2015

(65) Prior Publication Data

US 2015/0245472 A1  Aug. 27, 2015

(30) Foreign Application Priority Data

Feb. 25, 2014 (JP) ................. 2014-034484

(51) Int. Cl.
| | |
|---|---|
| H05K 1/02 | (2006.01) |
| G11B 5/48 | (2006.01) |
| H05K 1/05 | (2006.01) |
| H05K 3/24 | (2006.01) |
| G11B 5/00 | (2006.01) |

(52) U.S. Cl.
CPC ............. *H05K 1/0266* (2013.01); *G11B 5/484* (2013.01); *H05K 1/0269* (2013.01); *H05K 1/056* (2013.01); *H05K 3/244* (2013.01); *G11B 5/4853* (2013.01); *G11B 2005/0021* (2013.01); *Y10T 29/49128* (2015.01)

(58) Field of Classification Search
CPC ...................................... H05K 1/189
USPC ........................................ 361/749
See application file for complete search history.

(56) References Cited

U.S. PATENT DOCUMENTS

| | | | |
|---|---|---|---|
| 2003/0179552 A1* | 9/2003 | Sakata ................ | H01L 23/4985 361/749 |
| 2006/0124347 A1* | 6/2006 | Takaike .............. | H01L 25/0657 174/254 |
| 2008/0188020 A1* | 8/2008 | Wei-Min .................. | H05K 3/24 438/27 |
| 2009/0151994 A1 | 6/2009 | Ohsawa et al. | |
| 2013/0313005 A1* | 11/2013 | Nakamura ............. | H05K 1/112 174/255 |
| 2013/0319743 A1* | 12/2013 | Ishii ...................... | H05K 1/0296 174/260 |
| 2014/0002322 A1* | 1/2014 | Kanome .............. | H05K 1/0219 343/848 |

(Continued)

FOREIGN PATENT DOCUMENTS

JP  2009-129490 A  6/2009

*Primary Examiner* — Hoa C Nguyen
*Assistant Examiner* — Stanley Tso
(74) *Attorney, Agent, or Firm* — Jean C. Edwards, Esq.; Edwards Neils LLC

(57) ABSTRACT

A wired circuit board includes a first insulating layer, a first conductive layer provided over the first insulating film and including a first wire, a second insulating layer provided over the first insulating layer so as to cover the first wire, and a second conductive layer provided over the second insulating layer and including a second wire. The second conductive layer includes a first terminal portion for electrically connecting the first wire to an outside, a second terminal portion for electrically connecting the second wire to an outside, and a connection portion electrically connecting the first terminal portion and the first wire.

9 Claims, 10 Drawing Sheets

(56) References Cited

U.S. PATENT DOCUMENTS

| | | | |
|---|---|---|---|
| 2014/0029212 A1* | 1/2014 | Hwang | G09F 9/33 |
| | | | 361/749 |
| 2014/0268594 A1* | 9/2014 | Wang | H05K 1/183 |
| | | | 361/749 |
| 2014/0361004 A1* | 12/2014 | Jang | H05B 1/0294 |
| | | | 219/494 |
| 2015/0016074 A1* | 1/2015 | Tsujino | H01L 23/057 |
| | | | 361/749 |

* cited by examiner

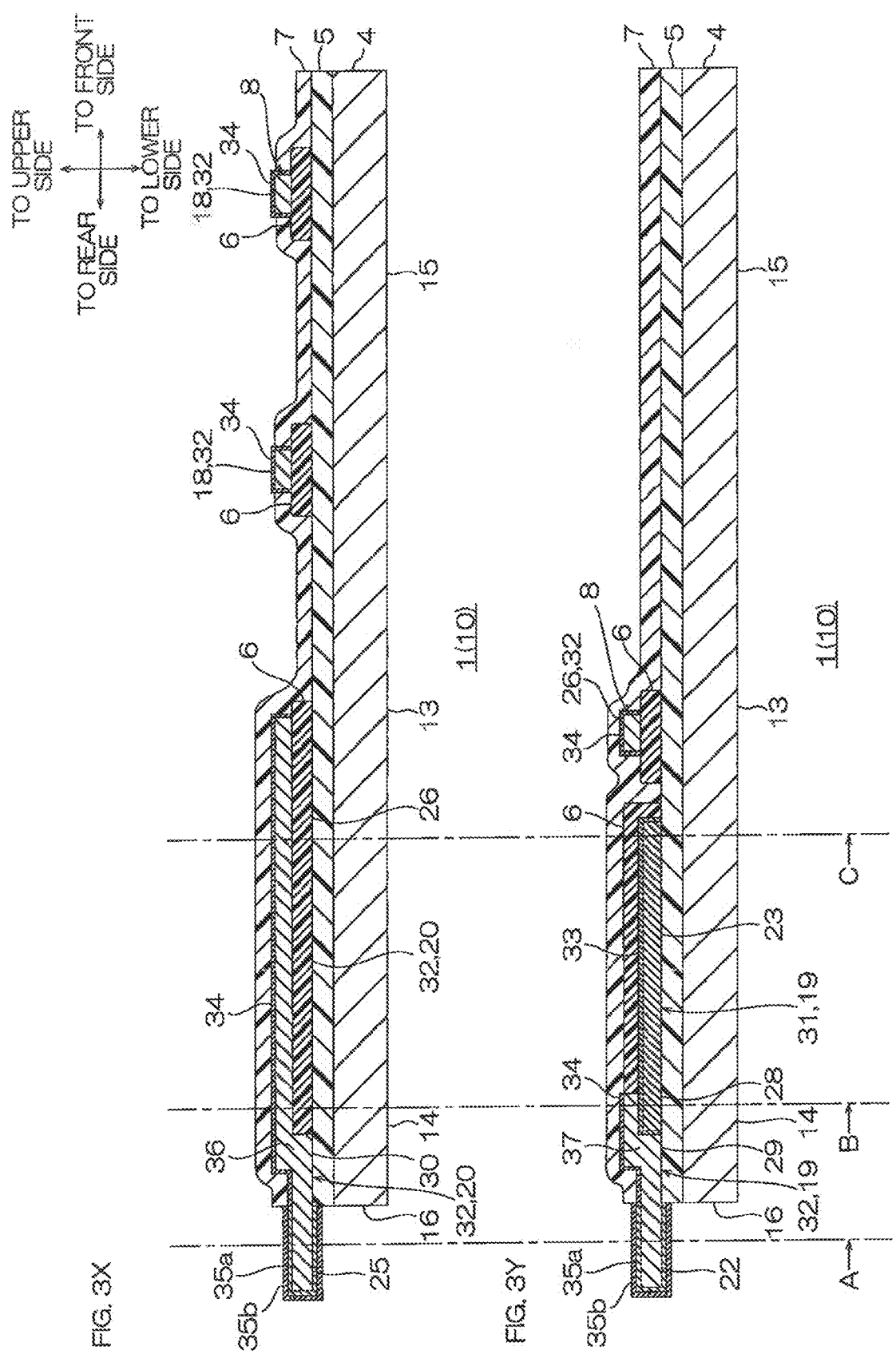

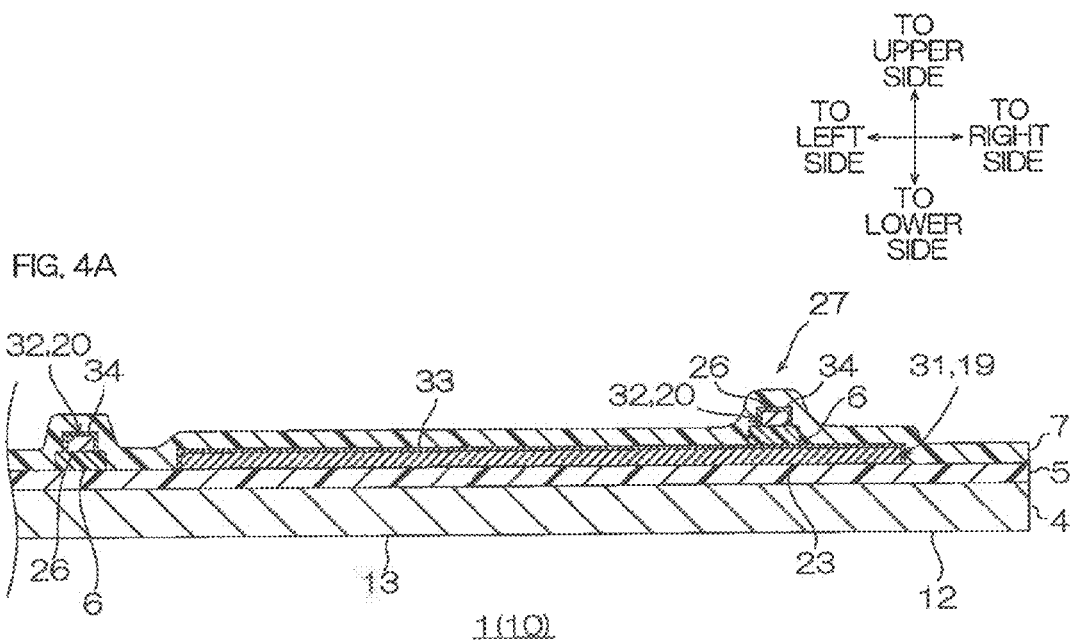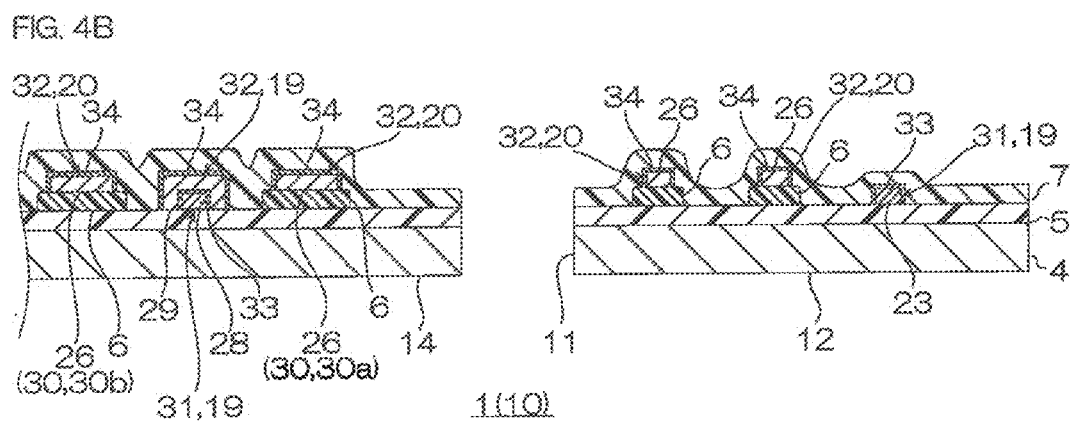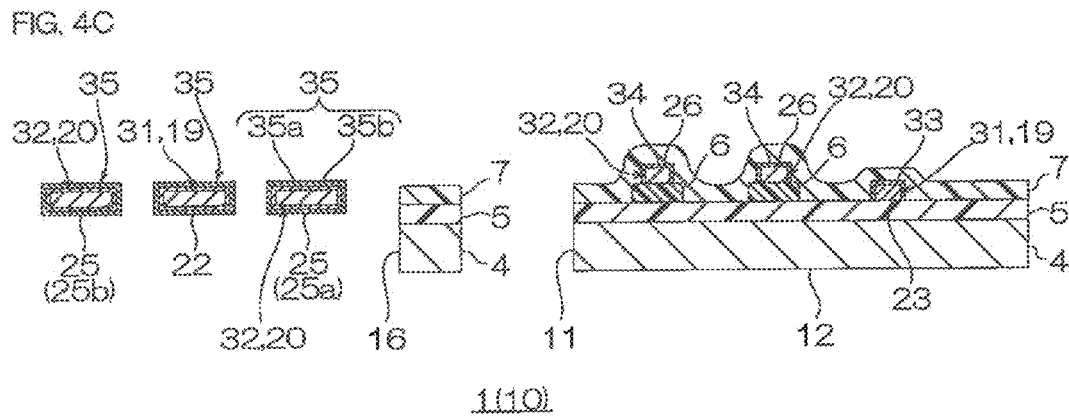

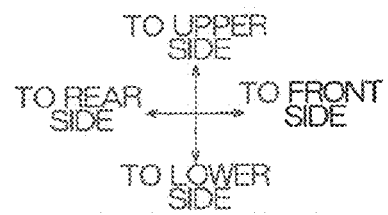
FIG. 6A
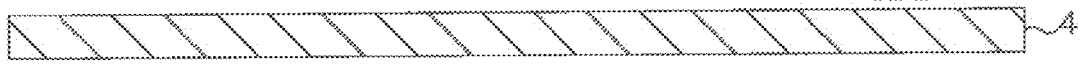
FIG. 6B
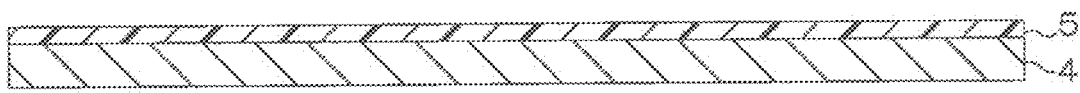
FIG. 6C
FIG. 6D
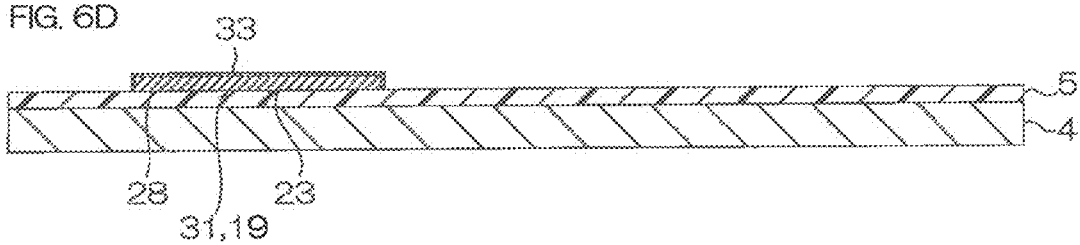
FIG. 6E
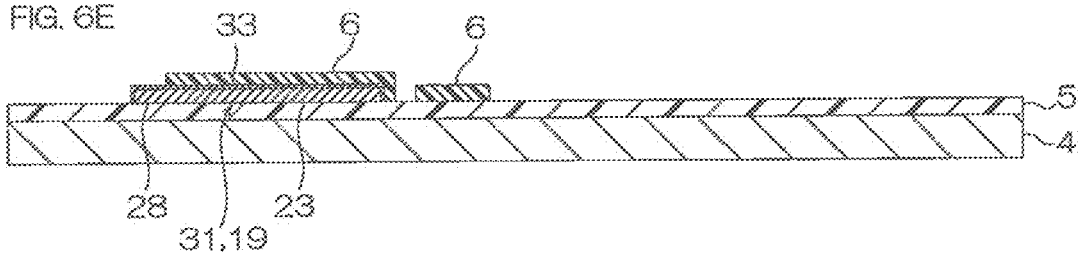
FIG. 6F
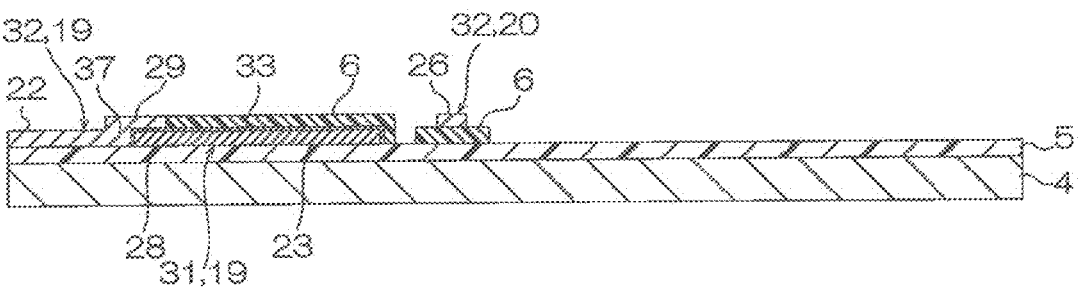

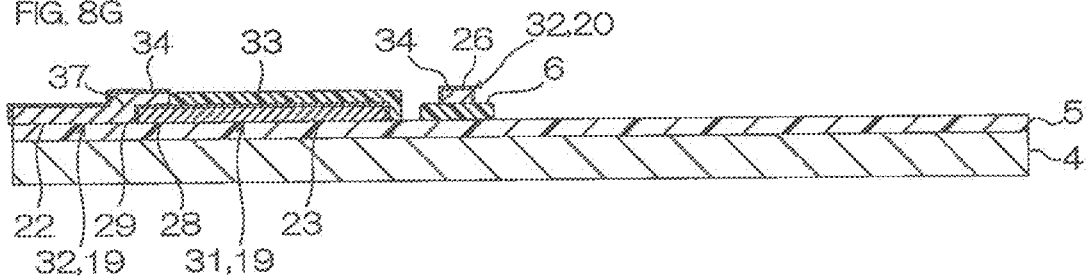
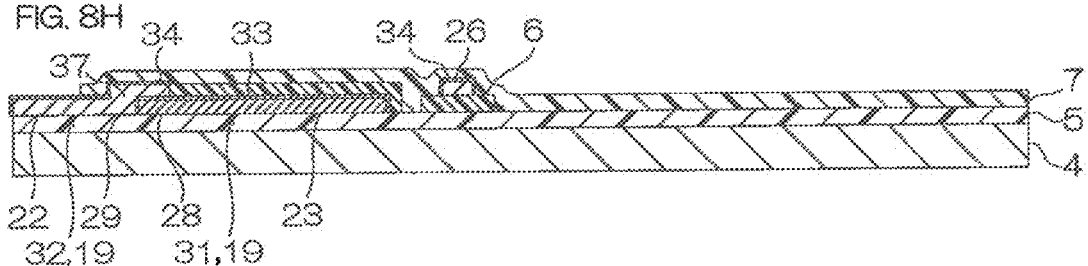
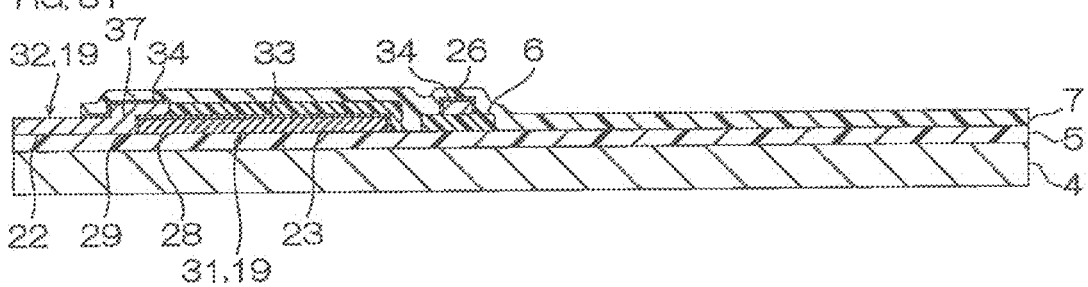
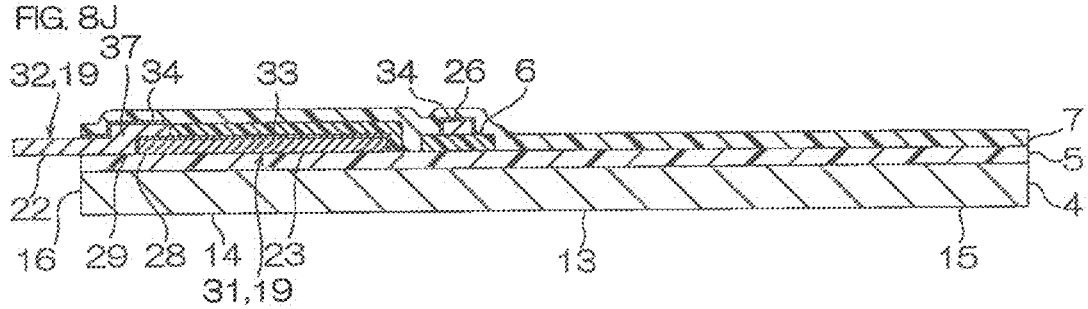
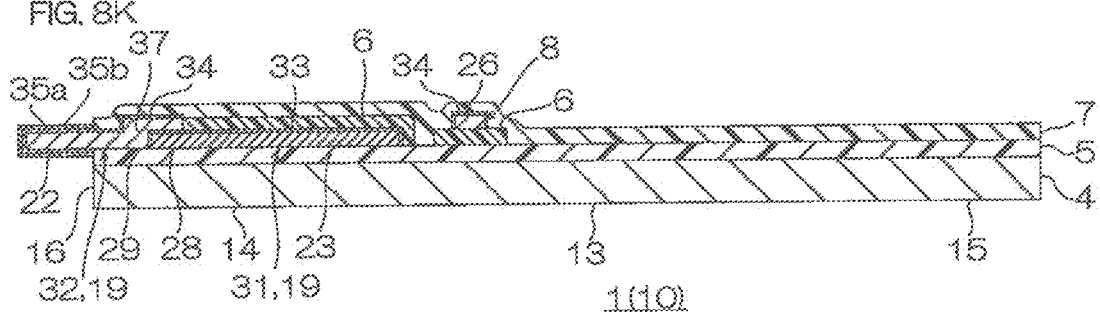

WIRED CIRCUIT BOARD AND PRODUCING METHOD THEREOF

CROSS-REFERENCE TO RELATED APPLICATION

The present application claims priority from Japanese Patent Application No. 2014-034484 filed on Feb. 25, 2014, the content of which is herein incorporated by reference into this application.

BACKGROUND OF THE INVENTION

Field of the Invention

The present invention relates to a wired circuit board and a producing method thereof, and particularly to a wired circuit board, such as a suspension board with circuit used in a hard disk drive, and a producing method thereof.

Description of the Related Art

A suspension board with circuit is used in a hard disk drive or the like, while a slider on which a magnetic head is mounted is mounted thereon. In recent years, on such suspension board circuits, various electronic elements have been mounted in addition to magnetic heads in accordance with the use purposes thereof. For example, on a suspension board with circuit for thermally-assisted recording, a light emitting element or the like is mounted. Thus, in a suspension board with circuit, to electrically connect an electronic element or a light emitting element and improve electric properties to the electronic element or the light emitting element, the number of terminal portions and wires to be connected to the electronic element or the light emitting element has increased. This requires the terminal portions and the wires to be placed at a higher density.

To meet the requirement, a suspension board with circuit has been proposed which includes a first insulating layer, a first conductive layer formed on the first insulating layer and having a first terminal portion and a first wire, a second insulating layer formed on the first insulating layer so as to cover the first conductive layer, and a second conductive layer formed on the second insulating layer and having a second terminal portion and a second wire (see, e.g., Japanese Unexamined Patent No. 2009-129490). In the suspension board with circuit of Japanese Unexamined Patent No. 2009-129490, over and under the second insulating layer, the first terminal portion/first wire and the second terminal portion/second wire can respectively be placed. This provides higher-density placement of the individual terminal portions and the individual wires.

SUMMARY OF THE INVENTION

However, in the suspension board with circuit of Japanese Unexamined Patent No. 2009-129490, the first and second conductive layers are formed in different steps. That is, the first terminal portion of the first conductive layer and the second terminal of the second conductive layer are formed in different steps. As a result, when the position of a resist for patterning the first conductive layer and/or the second conductive layer is displaced in a planar direction (direction perpendicular to a thickness direction) during the production process, the distance between the first and second terminal portions is different from an intended distance. This causes a problem in that the reliability of connection between the first and second terminal portions and a light emitting element and a magnetic head deteriorates.

It is therefore an object of the present invention to provide a wired circuit board in which the accuracy of the relative position of the first and second terminal portions is high and a producing method thereof.

A wired circuit board of the present invention includes a first insulating layer, a first conductive layer including a first wire provided over the first insulating layer, a second insulating layer provided over the first insulating layer so as to cover the first wire, and a second conductive layer including a second wire provided over the second insulating layer. The second conductive layer includes a first terminal portion for electrically connecting the first wire to an outside, a second terminal portion for electrically connecting the second wire to an outside, and a connection portion electrically connecting the first terminal portion and the first wire.

In the wired circuit board, the second conductive layer includes the first and second terminal portions. This allows the first and second terminal portions to be simultaneously provided in the step of providing the second conductive layer. Therefore, it is possible to improve the accuracy of the relative position of the first and second terminal portions.

In the wired circuit board of the present invention, it is preferable that the first conductive layer includes a connecting portion provided in the first wire, and the connecting portion is covered with the connection portion.

In the wired circuit board, the connecting portion is covered with the connection portion. This allows the connection portion to be reliably connected electrically to the connecting portion. Therefore, it is possible to improve the reliability of connection between the connection portion and the connecting portion.

In the wired circuit board of the present invention, it is preferable that the second insulating layer is formed with an opening exposing the first conductive layer, and the connection portion includes a conduction portion embedded in the opening to be electrically connected to the first wire.

In the wired circuit board, the connection portion is electrically connected to the first wire by the conduction portion embedded in the opening of the second insulating layer. This allows the connection portion to be placed even in a region where the first wire and/or the second wire are placed at a high density.

In the wired circuit board of the present invention, it is preferable that the conduction portion is provided to be spaced apart from the first terminal portion.

In the wired circuit board, the conduction portion is provided to be spaced apart from the first terminal portion. Accordingly, when a component to be mounted is solder-bonded to the first terminal portion, heat conduction from the heat resulting from soldering to the conduction portion can be suppressed. Therefore, it is possible to suppress the deterioration of the reliability of connection between the conduction portion and the first wire resulting from the solder bonding and consequently suppress the formation of a void resulting from the solder bonding in the conduction portion.

It is preferable that the wired circuit board of the present invention further includes a first electroless plating layer covering the first wire.

In the wired circuit board, the first wire is covered with the first electroless plating layer. Accordingly the first wire has excellent durability.

It is preferable that the wired circuit board of the present invention further includes a second electroless plating layer covering the second wire.

In the wired circuit board, the second wire is covered with the second electroless plating layer. Accordingly, the second wire has excellent durability.

It is preferable that the wired circuit board of the present invention further includes an electrolytic plating layer covering the first and second terminal portions.

In the wired circuit board, the first and second terminal portions are covered with the electrolytic plating layer. This can improve the reliability of connection between the first and second terminal portions and a component to be mounted.

In the wired circuit board of the present invention, it is preferable that the second conductive layer further includes a positioning mark for positioning a component to be mounted relative to the wired circuit board.

In the wired circuit board, the first and second terminal portions and the positioning mark are provided in the same second conductive layer. As a result, the accuracy of the relative position of the first and second terminal portions and the positioning mark is improved. Therefore, it is possible to accurately position the component to be mounted relative to the wired circuit board and improve the reliability of connection between the component to be mounted and the first and second terminal portions.

A method of producing a wired circuit board of the present invention includes the steps of preparing a first insulating layer, providing a first conductive layer including a first wire over the first insulating layer, providing a second insulating layer over the first insulating layer so as to cover the first wire therewith, and providing a second conductive layer including a second wire such that the second wire is placed on the second insulating layer. The second conductive layer includes a first terminal portion for electrically connecting the first wire to an outside, a second terminal portion for electrically connecting the second wire to an outside, and a connection portion electrically connecting the first terminal portion and the first wire.

In the method of producing a wired circuit board, the second conductive layer includes the first and second terminal portions. This allows the first and second terminal portions to be simultaneously provided in the step of providing the second conductive layer. Therefore, it is possible to improve the accuracy of the relative position of the first and second terminal portions.

It is preferable that the method of producing a wired circuit board of the present invention further includes the step of covering the first wire with a first electroless plating layer.

In the method of producing the wired circuit board, the first wire is covered with the first electroless plating layer. This can improve the durability of the first wire.

It is preferable that the method of producing a wired circuit board of the present invention further includes the step of covering the second wire with a second electroless plating layer.

In the method of producing the wired circuit board, the second wire is covered with the second electroless plating layer. This can improve the durability of the second wire.

In the method of producing the wired circuit board, it is preferable that the step of providing the first conductive layer, the step of providing the first electroless plating layer, the step of providing the second insulating layer, the step of providing the second conductive layer, and the step of providing the second electroless plating layer are performed in succession, and, in the step of providing the second electroless plating layer, the first and second terminal portions are covered with the second electroless plating layer. It is also preferable that the method of producing a wired circuit board of the present invention further includes the step of, after the step of providing the second electroless plating layer, removing the second electroless plating layer covering the first and second terminal portions, and then covering the first and second terminal portions with an electrolytic plating layer.

To produce such a wired circuit board as described in Japanese Unexamined Patent No. 2009-129490 in which a first terminal portion provided in a first conductive layer and a second terminal portion provided in a second conductive layer are respectively provided over and under a second insulating layer, the first conductive layer including the first terminal portion is covered with a first electroless plating layer. Then, the second conductive layer including the second terminal portion is covered with a second electroless plating layer. At this time, since the first electroless plating layer corresponding to the first terminal portion is exposed, the second electroless plating layer is provided so as to cover the first electroless plating layer. Thus, in the first terminal portion, the first and second electroless plating layers corresponding thereto, i.e., two electroless plating layers are formed relatively thick. To cover the first terminal portion with an electrolytic plating layer, it is necessary to remove the two electroless plating layers first. If it is attempted to remove the two electroless plating layers by etching or the like, the two electroless plating layers may not be able to be entirely removed or, even when the two electroless plating layers can entirely be removed, the first terminal portion may unintentionally be partially removed. This causes a problem in that the first terminal portion cannot reliably be formed to have an intended size.

By contrast, in accordance with the method of producing the wired circuit board of the present invention, after the step of covering the first conductive layer with the first electroless plating layer, in the step of providing the second conductive layer, the first terminal portion is provided. As a result, in the step of providing the second electroless plating layer, the first terminal portion is not covered with the first electroless plating layer, but is covered only with the second electroless plating layer. Consequently, the first and second terminal portions are covered with the same single second electroless plating layer. This allows the second electroless plating layer covering the first terminal portion and the second electroless plating layer covering the second terminal portion to be formed to have the same relatively small thickness. Therefore, it is possible to reliably remove the second electroless plating layer corresponding to the first terminal portion and the second electroless plating layer corresponding to the second terminal portion, i.e., the second electroless plating layers respectively corresponding to the first and second terminal portions, while successfully suppressing unintended partial removal of the first terminal portion. As a result, it is possible to reliably form the first terminal portion having an intended size and thus improve the accuracy of the dimensions of the first and second terminal portions.

Also, in the method of producing the wired circuit board, the first and second terminal portions are covered with an electrolytic plating layer. This can improve the reliability of connection to the component to be mounted.

The wired circuit board and the producing method thereof of the present invention can improve the accuracy of the relative position of the first and second terminal portions.

BRIEF DESCRIPTION OF THE DRAWINGS

FIGS. 3X and 3Y are side cross-sectional views of the suspension board with circuit shown in FIG. 2, of which FIG. 3X is a cross-sectional view along the X-X line in FIG. 2 and FIG. 3Y is a cross-sectional view along the line Y-Y in FIG. 2;

FIGS. 4A to 4C are front cross-sectional views of the suspension board with circuit shown in FIG. 2, of which FIG. 4A is a cross-sectional view along the line A-A in FIG. 2, FIG. 4B is a cross-sectional view along the line B-B in FIG. 2, and FIG. 4C is a cross-sectional view along the line C-C in FIG. 2;

FIGS. 5A to 5F are process views illustrating a method of producing the suspension board with circuit shown in FIG. 3X, of which FIG. 5A shows the step of preparing a metal supporting board, FIG. 5B shows the step of providing an insulating base layer, FIG. 5C shows the step of providing a first conductive layer, FIG. 5D shows the step of providing a first electroless plating layer, FIG. 5E shows the step of providing an intermediate insulating layer, and FIG. 5F shows the step of providing a second conductive layer;

FIGS. 6A to 6F are process views illustrating the method of producing the suspension board with circuit shown in FIG. 3Y, of which FIG. 6A shows the step of preparing the metal supporting board, FIG. 6B shows the step of providing the insulating base layer, FIG. 6C shows the step of providing the first conductive layer, FIG. 6D shows the step of providing the first electroless plating layer, FIG. 6E shows the step of providing the intermediate insulating layer, and FIG. 6F shows the step of providing the second conductive layer;

FIGS. 7G to 7K are process views illustrating the method of producing the suspension board with circuit shown in FIG. 3X, which are subsequent to FIG. 5F and of which FIG. 7G shows the step of providing a second electroless plating layer, FIG. 7H shows the step of providing an insulating cover layer, FIG. 7I shows the step of removing the electroless plating layers, FIG. 7J shows the step of forming a terminal opening, and FIG. 7K shows the step of providing an electrolytic plating layer;

FIGS. 8G to 8K are process views illustrating the method of producing the suspension board with circuit shown in FIG. 3Y, which are subsequent to FIG. 6F and of which FIG. 8G shows the step of providing the second electroless plating layer, FIG. 8H shows the step of providing the insulating cover layer, FIG. 8I shows the step of removing the electroless plating layers, FIG. 8J shows the step of forming the terminal opening, and FIG. 8K shows the step of providing the electrolytic plating layer;

DETAILED DESCRIPTION OF THE INVENTION

1. Outline of Suspension Board with Circuit

A suspension board with circuit as an embodiment of a wired circuit board of the present invention is described with reference to FIGS. 1, 2, 3X, 3Y, and 4A to 4C.

Figure 1:
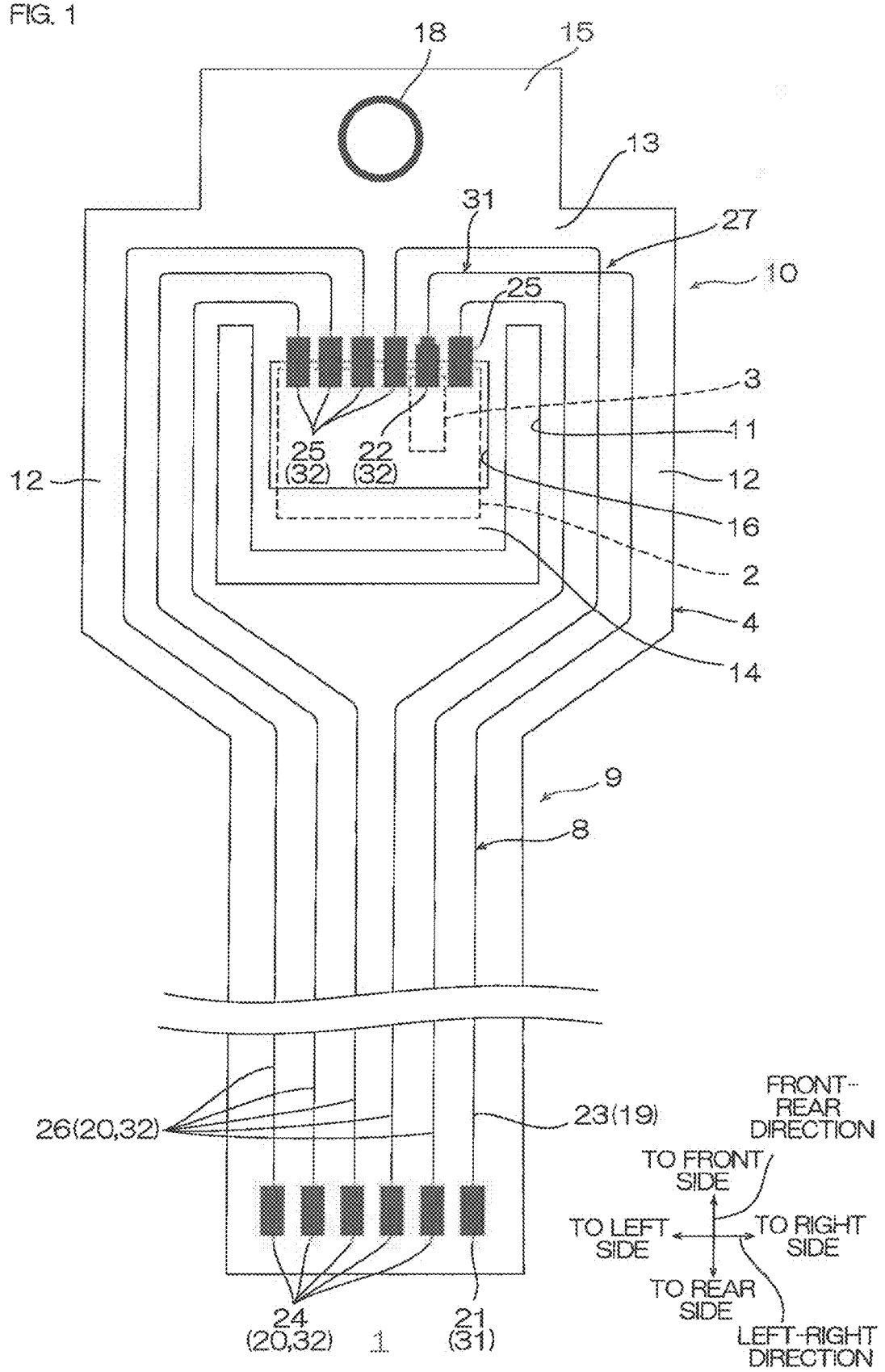
FIG. 1 is a plan view of a suspension board with circuit as an embodiment of a wired circuit board of the present invention.
Figure 2:
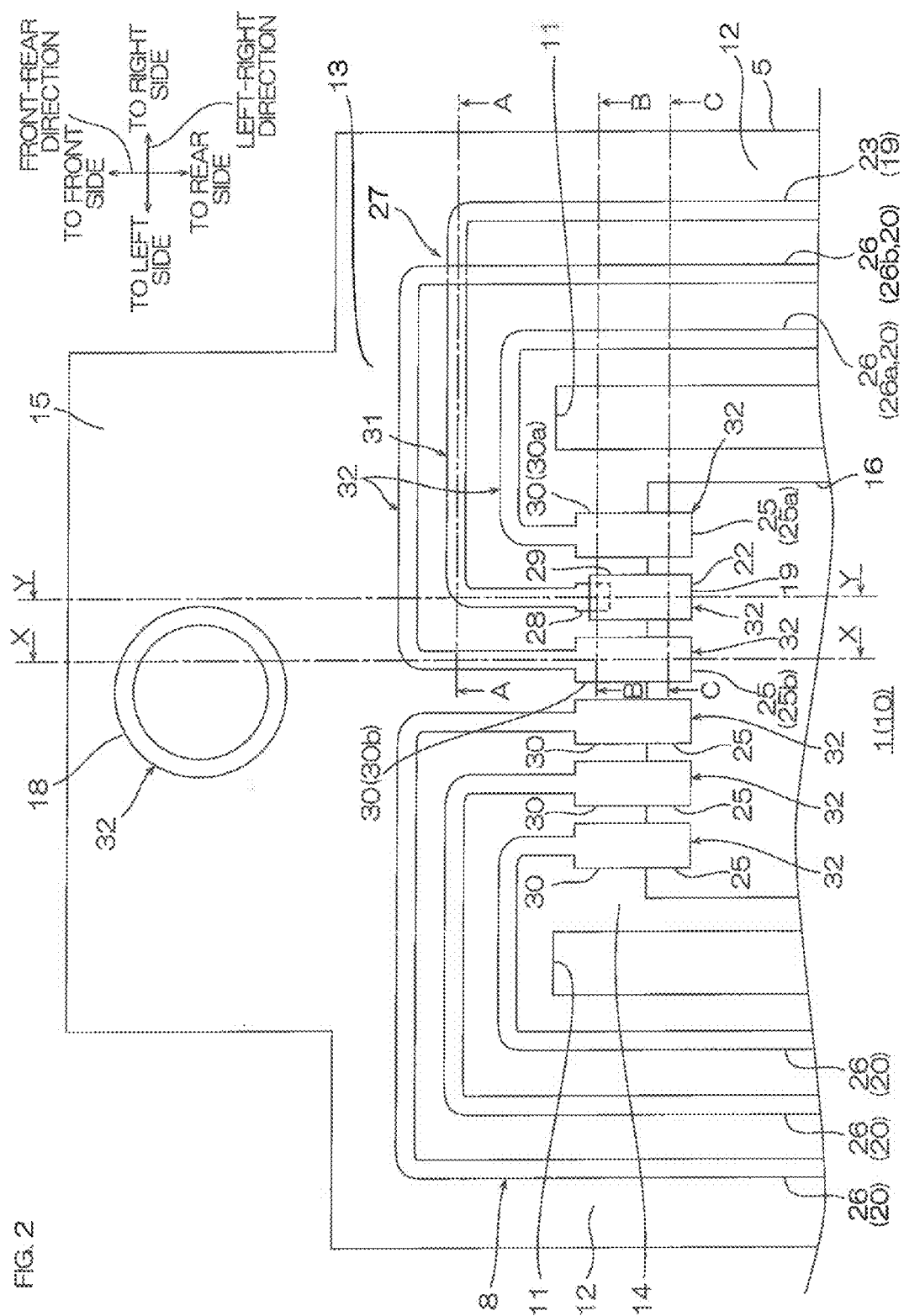
FIG. 2 is an enlarged plan view of a turn-back portion and a tongue portion in the suspension board with circuit shown in FIG. 1.

In the following description, when a direction associated with the suspension board with circuit is mentioned, it is assumed that a vertical direction along the surface of a paper sheet with FIG. 1 is a front-rear direction (first direction) and a lateral direction along the surface of the paper sheet with FIG. 1 is a left-right direction (widthwise direction or a second direction perpendicular to the first direction). It is also assumed that a direction extending between the front and back sides in a depth direction perpendicular to the surface of the paper sheet with FIG. 1 is a top-bottom direction (thickness direction or a third direction perpendicular to the first and second directions). The upper and lower sides of the surface of the paper sheet with FIG. 1 are a front side (one side in the first direction) and a rear side (the other side in the first direction). The left and right sides of the surface of the paper sheet with FIG. 1 are a left side (one side in the second direction) and a right side in the widthwise direction (the other side in the second diction). The front and back sides in the depth direction perpendicular to the surface of the paper sheet with FIG. 1 are an upper side (one side in the thickness direction or one side in the third direction) and a lower side (the other side in the thickness direction or the other side in the third direction). The directions in the drawings including and subsequent to FIG. 2 are based on the directions in FIG. 1.

In FIG. 1, an insulating base layer 5, an intermediate insulating layer 6, an insulating cover layer 7, a first electroless plating layer 33, a second electroless plating layer 34, and an electrolytic plating layer 35 each described later are omitted to clearly show the relative position of a metal supporting board 4 and a conductive pattern 8 each described layer.

As shown in FIG. 1, in the suspension board with circuit 1, the conductive pattern 8 is supported on the metal supporting board 4.

The metal supporting board 4 integrally includes a main body portion 9, and a gimbal portion 10 provided at the front side of the main body portion 9.

The main body portion 9 is formed in a generally rectangular shape in plan view extending in the front-rear direction.

The gimbal portion 10 is provided at the front side of the front end edge of the main body portion 9 to be continued therefrom and formed in a generally rectangular shape in plan view protruding outward on both sides of the main body portion 9 in the left-right direction. In the middle portion of the gimbal portion 10, a slit 11 is provided to extend through the metal supporting board 4 in the thickness direction thereof and have a generally U-shaped shape in plan view which is open toward the front side. The gimbal portion 10 includes outrigger portions 12, a turn-back portion 13, a tongue portion 14, and a mark-equipped portion 15.

The outrigger portions 12 are located on both outer sides of the slit 11 in the left-right direction. Each of the pair of outrigger portions 12 is formed in a generally rectangular shape in plan view extending in the front-rear direction.

The turn-back portion 13 is formed so as to connect the front end portions of the pair of outrigger portions 12. The turn-back portion 13 is formed in a generally rectangular shape in plan view extending in the left-right direction.

The tongue portion 14 is located inward of the slit 11 in the left-right direction to have a generally rectangular tongue shape in plan view extending rearward from the rear end edge of the turn-back portion 13. In the center portion of the tongue portion 14, a terminal opening 16 is provided to extend through the metal supporting board 4 in the thickness direction thereof.

The terminal opening 16 includes an element-side terminal 22 and a plurality of head-side terminals 25 (see FIG. 2)

each described later and is formed in a generally rectangular shape in plan view extending in the left-right direction. The terminal opening 16 is located inward of the slit 11 in the left-right direction to be spaced apart therefrom.

The mark-equipped portion 15 is located on the front side of the turn-back portion 13. Specifically, the mark-equipped portion 15 is formed in a generally rectangular shape in plan view extending from the front end edge of the middle portion of the turn-back portion 13 in the left-right direction toward the front side.

The conductive pattern 8 is provided to extend between the front and rear end portions of the suspension board with circuit 1 and includes a power source pattern 19 and a plurality of (five) signal patterns 20.

The power source pattern 19 integrally includes a power-source-side terminal 21 provided in the main body portion 9, the element-side terminal 22 as a first terminal portion provided in the gimbal portion 10, and a power source wire 23 as a first wire electrically connecting the power-source-side terminal 21 and the element-side terminal 22. As shown in FIG. 2, the front end portion of the power source wire 23 is provided with a connecting end portion 28 described later. As shown in FIG. 1, each of the plurality of signal patterns 20 integrally includes an external-side terminal 24 provided in the main body portion 9, a head-side terminal 25 as a second terminal portion provided in the gimbal portion 10, and an external wire 26 and a communicating portion 30 (see FIG. 2) each as a second wire electrically connecting the external-side terminal 24 and the head-side terminal 25.

The power-source-side terminal 21 and the plurality of external-side terminals 24 are arranged in the rear end portion of the main body portion 9 to be spaced apart from each other in the left-right direction. Each of the power-source-side terminal 21 and the plurality of external-side terminals 24 is formed in a generally rectangular land shape in plan view. The power-source-side terminal 21 is located on the right side of the plurality of external-side terminals 24 to be spaced apart therefrom. The power-source-side terminal 21 is a terminal to be electrically connected to a power source (not shown). The plurality of external-side terminals 24 are terminals to be electrically connected to an external circuit board (not shown) such as a read/write board.

The element-side terminal 22 and the plurality of head-side terminals 25 are arranged along the front end edge of the terminal opening 16 in the gimbal portion 10 to be spaced apart from each other in the left-right direction. Each of the element-side terminal 22 and the plurality of head-side terminals 25 is formed in a generally rectangular land shape in plan view extending from the front end edge of the terminal opening 16 toward the rear side. The element-side terminal 22 is provided between the adjacent two head-side terminals 25. Specifically, the element-side terminal 22 is placed between a first head-side terminal 25a located at the rightmost position and a second head-side terminal 25b located on the left side of the first head-side terminal 25a to be adjacent thereto. As shown by the broken line in FIG. 1, the element-side terminal 22 is a terminal to be electrically connected to a light emitting element 3 as an external component (to be mounted). The head-side terminals 25 are terminals to be electrically connected to a slider 2 as an external component (to be mounted) on which a magnetic head (not shown) is mounted.

As shown in FIG. 1, the power source wire 23 and the plurality of external wires 26 extend over the main body portion 9 and the gimbal portion 10 along the front-rear direction to be spaced apart from each other, except at a cross portion 27 described later. Specifically, the power source wire 23 and the plurality of external wires 26 are placed to extend from the respective front ends of the power-source-side terminal 21 and the plurality of external-side terminals 24 to the front side in the main body portion 9. Then, in the outrigger portions 12, the power source wire 23 and the plurality of external wires 26 skew outward in the left-right direction and extend to the front side so as to pass through the outrigger portions 12. At the front end portions of the outrigger portions 12, the power source wire 23 and the plurality of external wires 26 are bent inward in the left-right direction. Then, as shown in FIG. 2, the power source wire 23 and the plurality of external wires 26 are bent rearward at the middle portion of the gimbal portion 10 in the left-right direction between the outrigger portions 12 to reach the respective front end portions of the element-side terminal 22 and the plurality of head-side terminals 25 at the front end portion of the tongue portion 14. Note that the power source wire 23 is provided so as to cross a second external wire 26b connected to the second head-side terminal 25b in plan view at the cross portion 27 in the turn-back portion 13.

As shown in FIGS. 1 and 2, the power source wire 23 is electrically connected to the power source via the power-source-side terminal 21 and also electrically connected to the light emitting element 3 via the element-side terminal 22. The power source wire 23 is a power wire which conducts an electric current supplied from the power source (not shown) to the light emitting element 3. The plurality of external wires 26 are electrically connected to the external circuit board via the plurality of external-side terminals 24 and also electrically connected to the magnetic head in the slider 2 via the plurality of head-side terminals 25. The plurality of external wires 26 are differential wires which transmit differential signals (read signal and/or write signal).

2. Layer Configuration of Suspension Board with Circuit

As shown in FIGS. 3X and 4A, the suspension board with circuit 1 includes the metal supporting board 4, the insulating base layer 5 as a first insulating layer, a first conductive layer 31, the first electroless plating layer 33, the intermediate insulating layer 6 as a second insulating layer, a second conductive layer 32, the second electroless plating layer 34, the insulating cover layer 7, and the electrolytic plating layer 35.

The metal supporting board 4 forms the outer shape of the suspension board with circuit 1 and is made of a metal foil having a flat plate shape or a metal thin plate. As shown in FIG. 1, the gimbal portion 10 of the metal supporting board 4 is provided with the slit 11 and the terminal opening 16.

As shown in FIGS. 3X and 4A, the insulating base layer 5 is provided over the metal supporting board 4. More specifically, the insulating base layer 5 is placed on the upper surface of the metal supporting board 4 so as to have the same outer shape as that of the metal supporting board 4 in plan view.

As shown in FIGS. 4A and 4C, the first conductive layer 31 is provided over the insulating base layer 5. As shown in FIGS. 1 and 2, the first conductive layer 31 includes a part of the power source pattern 19. As shown in FIGS. 2 and 4A, the first conductive layer 31 includes the power-source-side terminal 21 (see FIG. 1) and the power source wire 23 (including the connecting end portion 28) which are provided over the upper surface of the insulating base layer 5.

As shown in FIGS. 2 and 3Y, the power source wire 23 has the connecting end portion 28 as a connecting portion at the front end portion thereof. More specifically, the connecting end portion 28 is provided at the rear end portion of the power source wire 23 which is bent rearward in the turn-back portion 13 and formed to have a generally rectangular shape (quadrilateral land shape) in plan view which is wider than the middle portion in the front-rear direction of the power source wire 23 which is bent rearward in the turn-back portion 13. Note that, in plan view, the connecting end portion 28 is located on the front side of the front end edge of the terminal opening 16 to be spaced apart therefrom.

As shown in FIGS. 3Y and 4A, the first electroless plating layer 33 is provided so as to cover the surfaces (top and side surfaces) of the power source wire 23.

As shown in FIGS. 3X and 4A, the intermediate insulating layer 6 is provided over the insulating base layer 5 so as to cover the power source wire 23. Specifically, the intermediate insulating layer 6 is provided over the upper surface of the insulating base layer 5 and the top surface of the first electroless plating layer 33 (except for the portion of the first electroless plating layer 33 which covers a connection portion 29 described later) covering the power source wire 23. More specifically, as shown in FIGS. 3X and 3Y, the intermediate insulating layer 6 is formed over the insulating base layer 5 so as to correspond to the external wires 26, the external-side terminals 24 (see FIG. 1), and a positioning mark 18 (see FIG. 1).

As shown in FIGS. 1 and 2, the second conductive layer 32 includes the signal patterns 20, the remaining portion of the power source pattern 19, and the positioning mark 18. Specifically, the second conductive layer 32 includes the external-side terminals 24, the external wires 26, the communicating portions 30, and the head-side terminals 25 in the signal patterns 20 and the connection portion 29, the element-side terminal 22, and the positioning mark 18 in the power source pattern 19.

As shown in FIGS. 1 and 3X, the external-side terminals 24 are provided over the intermediate insulating layer 6. The plurality of external-side terminals 24 are provided to be spaced apart from each other in the left-right direction. The plurality of external-side terminals 24 are provided over the upper surface of the intermediate insulating layer 6 in the rear end portion of the main body portion 9. Each of the plurality of external-side terminals 24 is formed in a generally rectangular shape (quadrilateral land shape) extending in the front-rear direction.

As shown in FIGS. 3Y and 4B, the external wires 26 are provided over the intermediate insulating layer 6. As shown in FIG. 4A, the external wire 26 is placed such that, at the cross portion 27 (see FIG. 2) where the external wire 26 crosses the power source wire 23 in plan view, the intermediate insulating layer 6 is interposed between the external wire 26 and the first electroless plating layer 33 covering the power source wire 23 in the thickness direction.

As is described later in detail, as shown in FIG. 3X, each of the communicating portions 30 is provided to extend over the insulating base layer 5 and the intermediate insulating layer 6.

As is described later in detail, the head-side terminals 25 are formed in the same layer (specifically, the second conductive layer) as that of the communicating portions 30 so as to be exposed from the insulating cover layer 7 and the insulating base layer 5.

As is described later in detail, as shown in FIG. 3Y, the connection portion 29 is formed to extend over the insulating base layer 5 and the intermediate insulating layer 6.

As is described later in detail, the element-side terminal 22 is formed in the same layer (specifically, the second conductive layer) as that of the connection portion 29 so as to be exposed from the insulating cover layer 7 and the insulating base layer 5.

As shown in FIG. 3X, the positioning mark 18 is provided over the intermediate insulating layer 6. Specifically, as shown in FIG. 2, the positioning mark 18 is placed at the generally center portion of the mark-equipped portion 15 to have a generally annular shape in plan view.

As shown in FIGS. 3X and 3Y, the second electroless plating layer 34 is provided so as to cover the respective surfaces (top and side surfaces) of the external wires 26, the communicating portions 30, the connection portion 29, and the positioning mark 18.

As shown in FIGS. 3X and 4A, the insulating cover layer 7 is provided over the insulating base layer 5 and the intermediate insulating layer 6 so as to cover the first and second electroless plating layers 33 and 34. Specifically, the insulating cover layer 7 is formed over the insulating base layer 5 and the intermediate insulating layer 6 so as to expose the portion of the second electroless plating layer 34 which covers the positioning mark 18 and cover the first and second electroless plating layer 33 and 34 (except for the portion of the second electroless plating layer 34 which covers the positioning mark 18).

As shown in FIGS. 3X and 3Y, the electrolytic plating layer 35 is provided so as to cover the respective top surfaces of the element-side terminal 22, the head-side terminals 25, the power-source-side terminal 21 (see FIG. 1), and the external-side terminals 24 (see FIG. 1). Specifically, the electrolytic plating layer 35 is provided so as to cover the respective upper, lower, and side surfaces (right, left, and rear surfaces) of the element-side terminal 22 and the head-side terminals 25 and also cover the respective upper and side surfaces of the power-source-side terminal 21 (see FIG. 1) and the external-side terminals 24 (see FIG. 1).

The electrolytic plating layer 35 includes, e.g., a plurality of layers (two layers). More specifically, the electrolytic plating layer 35 includes a first electrolytic plating layer 35a covering the respective top surfaces of the element-side terminal 22, the head-side terminals 25, the power-source-side terminal 21 (see FIG. 1), and the external-side terminals 24 (see FIG. 1), and a second electrolytic plating layer 35b covering the top surface of the first electrolytic plating layer 35a.

3. Detailed Description of Communicating Portions, Head-Side Terminals, Connection Portion, and Element-Side Terminal (1) Communicating Portions As shown in FIG. 2, the plurality of (five) communicating portions 30 are provided in the front end portion of the tongue portion 14. The communicating portions 30 are arranged to be spaced apart from each other in the left-right direction and also spaced apart from the connecting end portion 28 (described later) and the connection portion 29 (described later) in the left-right direction. Specifically, two communicating portions 30a and 30b continued to the first and second head-side terminals 25a and 25b are arranged such that the connecting end portion 28 and the connection portion 29 are interposed therebetween. The plurality of communicating portions 30 are provided so as to correspond to the plurality of (five) external wires 26. Specifically, the plurality of communicating portions 30 are provided to be continued to the respective rear end portions of the plurality of external wires 26 bent rearward in the turn-back portion 13. Specifically, each of the plurality of communicating portions 30 is formed in a generally rectangular shape (quadrilateral land shape) in plan view which is wider than the middle portion in the front-rear direction of each of the external wires 26 which are bent rearward in the turn-back portion 13.

Also, as shown in FIG. 3X, the communicating portions 30 are formed over the insulating base layer 5 and the intermediate insulating layer 6. Specifically, the front end portion of each of the communicating portions 30 is formed on the upper surface of the intermediate insulating layer 6, the middle portion of the communicating portion 30 in the front-rear direction is formed over the rear surface of the intermediate insulating layer 6 so as to extend downward from the upper surface of the intermediate insulating layer 6, and the rear end portion of the communicating portion 30 is formed on the upper surface of the insulating base layer 5 exposed from the intermediate insulating layer 6. That is, each of the communicating portions 30 is formed so as to continuously cover the upper and rear surfaces of the intermediate insulating layer 6 and the upper surface of the insulating base layer 5 in side cross-sectional view. That is, the communicating portion 30 is formed in a generally Z-shaped shape including a first stepped portion 36 in side cross-sectional view. As shown in FIGS. 2 and 3Y, in plan view, the communicating portions 30 are provided as head-side front land portions defined on the front side of the front end edge of the terminal opening 16. Specifically, the communicating portions 30 are defined as portions covered with the insulating cover layer 7 via the second electroless plating layer 34.

(2) Head-Side Terminals

As shown in FIG. 2, in plan view, the plurality of (five) head-side terminals 25 are provided in the terminal opening 16. Specifically, the head-side terminals 25 are provided to correspond to the plurality of communicating portions 30. Each of the plurality of head-side terminals 25 is formed in a generally rectangular shape in plan view which is continued from the rear end edge of the communicating portion 30 to have the same width as that of the communicating portion 30 and extend rearward. That is, in plan view, the head-side terminals 25 are arranged so as to extend rearward inside the terminal opening 16 from the front end edge thereof.

In plan view, the head-side terminals 25 are provided as head-side rear land portions defined on the rear side of the front end edge of the terminal opening 16. Specifically, as shown in FIG. 3Y, the head-side terminals 25 are defined as portions having the upper and lower surfaces thereof exposed from each of the insulating base layer 5 and the insulating cover layer 7 and also having the upper, lower, and side surfaces thereof covered with the electrolytic plating layer 35. Also, as shown in FIGS. 3Y and 4C, the lower surfaces of the head-side terminals 25 are formed at the same positions as that of the upper surface of the insulating base layer 5 when projected in the left-right direction. Also, as shown in FIG. 2, each of the plurality of head-side terminals 25 (head-side rear land portions) forms, together with each of the plurality of communicating portions 30 (head-side front land portion), one quadrilateral land which is long in the front-rear direction.

As shown in FIG. 2, the plurality of head-side terminals 25 are electrically connected individually to the plurality of communicating portions 30 (external wires 26).

(3) Connection Portion

The connection portion 29 is provided in the tongue portion 14. The connection portion 29 is located to be spaced apart from the plurality of communicating portions 30 in the left-right direction. Specifically, the connection portion 29 is placed between the two communicating portions 30a and 30b which are continued to the first and second head-side terminals 25a and 25b. The front end portion of the connection portion 29 is located so as to overlap the rear end portion of the connecting end portion 28 in plan view.

Specifically, the connection portion 29 has a generally rectangular shape (quadrilateral land shape) in plan view which is wider than the connecting end portion 28. In plan view, the front end edge of the connection portion 29 is located so as to traverse the middle portion of the connecting end portion 28 in the left-right direction. In plan view, the connection portion 29 is defined as an element-side front land portion defined on the front side of the front end edge of the terminal opening 16. Specifically, as shown in FIG. 3X, the connection portion 29 is defined as a portion covered with the insulating cover layer 7 via the second electroless plating layer 34.

As shown in FIGS. 2 and 3X, the front end portion of the connection portion 29 covers the top surface of the rear end portion of the connecting end portion 28 via the first electroless plating layer 33. Specifically, as shown in FIGS. 3Y and 4B, the front end portion of the connection portion 29 covers the top surface of the first electroless plating layer 33 covering the upper, left, right, and rear surfaces of the connecting end portion 28. Specifically, the middle portion of the front end portion of the connection portion 29 covers the top surface of the first electroless plating layer 33 covering the upper surface of the connecting end portion 28. The middle portion (see FIG. 3Y) of the connection portion 29 in the front-rear direction and the both end portions (see FIG. 4B) of the front end portion thereof in the left-right direction are formed on the surfaces of the first electroless plating layer 33 covering the rear surface (see FIG. 3Y) of the connecting end portion 28 and the both surfaces (see FIG. 4B) thereof in the left-right direction so as to extend downward from the top surface of the first electroless plating layer 33 covering the upper surface of the connecting end portion 28. As also shown in FIG. 3Y, the rear end portion of the connection portion 29 is formed on the upper surface of the insulating base layer 5. That is, the connection portion 29 includes a second stepped portion 37 covering the rear end portion of the connecting end portion 28 and is formed in a generally Z-shaped shape in side cross-sectional view. As also shown in FIG. 4B, in front cross-sectional view, the connection portion 29 is formed in a generally U-shaped shape which opens downward so as to surround the connecting end portion 28.

(4) Element-Side Terminal

As shown in FIG. 2, the element-side terminal 22 is provided in the terminal opening 16 in plan view. Specifically, the element-side terminal 22 is provided to correspond to the connection portion 29. Specifically, the element-side terminal 22 is formed in a generally rectangular shape in plan view extending rearward continuously from the rear end edge of the connection portion 29 to have the same width as that of the connection portion 29. In short, the element-side terminal 22 is placed so as to extend rearward inside the terminal opening 16 from the front end edge thereof. That is, in plan view, the element-side terminal 22 is defined as an element-side rear land portion which is defined on the rear side of the front end edge of the terminal opening 16 in plan view. Specifically, as shown in FIG. 3Y, the element-side terminal 22 is defined as a portion having the upper and lower surfaces thereof exposed from each of the insulating base layer 5 and the insulating cover layer 7 and also having the upper, lower, and side surfaces thereof covered with the electrolytic plating layer 35. The element-side terminal 22 (element-side rear land portion) forms, together with the connection portion 29 (element-side front land portion), one quadrilateral land which is long in the front-rear direction.

Also, as shown in FIGS. 3Y and 4C, the lower surface of the element-side terminal 22 is located at the same position as those of the respective lower surfaces of the head-side terminals 25 and the upper surface of the insulating base layer 5 when projected in the left-right direction. The element-side terminal 22 is electrically connected to the connecting end portion 28 (power source wire 23) via the connection portion 29.

4. Method of Producing Suspension Board with Circuit

Next, a method of producing the suspension board with circuit 1 is described with reference to FIGS. 5A to 5F, 6A to 6F, 7G to 7K, and 8G to 8K.

Figure 5A:

First, in the method, as shown in FIGS. 5A and 6A, the metal supporting board 4 is prepared. Examples of the metal material of the metal supporting board 4 include stainless steel and a 42-alloy. Preferably, stainless steel or the like is used.

The metal supporting board 4 has a thickness in a range of, e.g., not less than 5 µm, or preferably not less than 10 µm and, e.g., not more than 60 µm, or preferably not more than 25 µm.

Figure 5B:
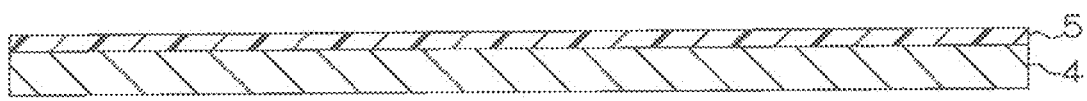
Figure 5C:
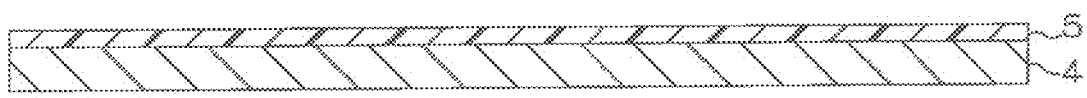
Figure 5D:
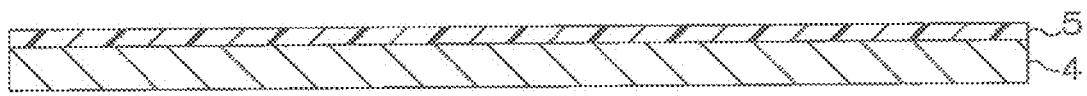

Next, in the method, as shown in FIGS. 5B and 6B, the insulating base layer 5 is provided in the foregoing pattern on the metal supporting board 4.

Examples of the insulating material of the insulating base layer 5 include synthetic resins such as polyimide, polyether nitrile, polyether sulfone, polyethylene terephthalate, polyethylene naphthalate, and polyvinyl chloride. Preferably, a photosensitive synthetic resin is used, or more preferably, photosensitive polyimide is used.

To provide the insulating base layer 5 on the metal supporting board 4, e.g., a solution (varnish) of a photosensitive synthetic resin is applied to the upper surface of the metal supporting board 4, dried, then exposed to light, developed, and cured as necessary. The formation of the insulating base layer 5 is not limited to the method mentioned above. For example, it is also possible to preliminarily form a synthetic resin into a film and stick the film to the upper surface of the metal supporting board 4 via a known adhesive layer.

The insulating base layer 5 has a thickness in a range of, e.g., not less than 1 µm, or preferably not less than 4 µm and, e.g., not more than 30 µm, or preferably not more than 10 µm.

Next, in the method, as shown in FIG. 6C, on the insulating base layer 5, the first conductive layer 31 is provided in the foregoing pattern. Specifically, the power source wire 23 (including the connecting end portion 28) and the power-source-side terminal 21 (see FIG. 1) are formed on the upper surface of the insulating base layer 5. Note that the power source wire 23 can also be formed so as to be grounded to the metal supporting board 4.

Examples of the conductive material of the first conductive layer 31 include copper, nickel, gold, a solder, and an alloy thereof. Among them, copper is preferably used.

To provide the first conductive layer 31, a known patterning method such as, e.g., an additive method or a subtractive method is used. Preferably, the additive method is used.

The dimensions of the first conductive layer 31 are set appropriately. The width of the power-source-side terminal 21 is in a range of, e.g., not less than 15 µm, or preferably not less than 20 µm and, e.g., not more than 1000 µm, or preferably not more than 800 µm. The width of the power source wire 23 is in a range of, e.g., not less than 1 µm, or preferably not less than 4 µm and, e.g., not more than 500 µm, or preferably not more than 100 µm. The length of the connecting end portion 28 in each of the front-rear direction and the left-right direction is in a range of, e.g., not less than 5 µm, or preferably not less than 10 µm and, e.g., not more than 500 nm, or preferably not more than 200 µm. The thickness of the first conductive layer 31 is in a range of, e.g., not less than 1 µm, or preferably not less than 4 µm and, e.g., not more than 30 µm, or preferably not more than 20 µm.

Next, in the method, as shown in FIG. 6D, the first electrolytic plating layer 33 is provided so as to cover the top surface of the first conductive layer 31. Specifically, the respective top surfaces of the power source wire 23 and the power-source-side terminal 21 (see FIG. 1) are covered with the first electroless plating layer 33.

The first electroless plating layer 33 is provided by a known method such as, e.g., dipping the first conductive layer 31 into an electroless plating solution.

Examples of the plating material of the first electroless plating layer 33 include a conductive protective material such as nickel or tin. Preferably, in terms of satisfactorily protecting the first conductive layer 31, nickel is used.

The first electroless plating layer 33 has a thickness in a range of, e.g., not less than 0.001 µm, or preferably not less than 0.01 µm and, e.g., not more than 5 µm, or preferably not more than 1 µm.

Figure 5E:

Next, in the method, as shown in FIGS. 5E and 6E, the intermediate insulating layer 6 is provided in the foregoing pattern on the insulating base layer 5 so as to cover the first electroless plating layer 33. Specifically, the intermediate insulating layer 6 is provided over the insulating base layer 5 so as to cover the first electroless plating layer 33 (except for the portion thereof to be provided with the connection portion 29 (see FIG. 6F) formed in the subsequent steps) and correspond to the external wires 26 (see FIG. 6F) and the external-side terminals 24 (see FIG. 1) which are formed in the subsequent steps.

As the insulating material of the intermediate insulating layer 6, the same insulating material as that of the insulating base layer 5 is used.

To provide the intermediate insulating layer 6, a solution (varnish) of a photosensitive synthetic resin is applied to the upper surface of the insulating base layer 5, dried, then exposed to light, developed, and cured as necessary. The formation of the intermediate insulating layer 6 is not limited to the method described above. It is also possible to, e.g., preliminarily form a synthetic resin into a film and stick the film to the upper surface of the insulating base layer 5 via a known adhesive layer.

The intermediate insulating layer 7 has a thickness in a range of, e.g., not less than 1 µm, or preferably not less than 2 µm and, e.g., not more than 30 µm, or preferably not more than 10 µm.

Figure 5F:
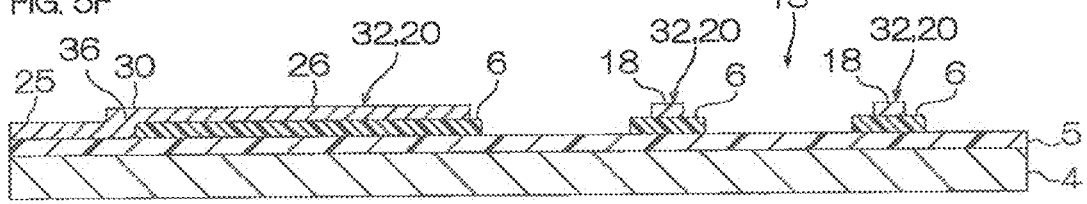

Next, in the method, as shown in FIGS. 5F and 6F, the second conductive layer 32 is provided. Specifically, the external wires 26 are formed on the upper surface of the intermediate insulating layer 6. As also shown in FIG. 5F, the communicating portions 30 are formed such that the front end portions thereof are located on the upper surface of the intermediate insulating layer 6 and the rear end portions thereof are located on the upper surface of the insulating base layer 5. As also shown in FIG. 6F, the connection portion 29 is formed such that the front end portion thereof and the middle portion thereof in the front-rear direction cover the top surface of the first electroless plating layer 33 and the rear end portion thereof covers the upper surface of the insulating base layer 5. As also shown in FIGS. 5F and 6F, the element-side terminal 22 and the head-side terminals 25 are both simultaneously formed on the upper surface of the insulating base layer 5. At the same time, the positioning mark 18 is formed on the upper surface of the intermediate insulating layer 6.

As the conductive material of the second conductive layer 32, the same metal material as that of the first conductive layer 31 is used.

To provide the second conductive layer 32, the same patterning method as mentioned above is used. Preferably, the additive method is used. The dimensions of the second conductive layer 32 are set appropriately.

The dimensions of the second conductive layer 32 are set appropriately. The respective widths of the plurality of external-side terminals 24, the respective widths of the plurality of head-side terminals 25, the widths of the communicating portions 30, and the width of the element-side terminal 22 are in a range of, e.g., not less than 15 µm, or preferably not less than 20 µm and, e.g., not more than 1000 µm, or preferably not more than 800 µm. The spacing between the plurality of external-side terminals 24, the spacing between the plurality of head-side terminals 25, and the distance between the element-side terminal 22 and the first head-side terminal 25a (or the second head-side terminal 25b) are in a range of, e.g., not less than 15 µm, or preferably not less than 20 µm and, e.g., not more than 1000 µm, or preferably not more than 800 µm. The widths of the external wires 26 are in a range of, e.g., not less than 1 nm, or preferably not less than 4 µm and, e.g., not more than 1000 µm, or preferably not more than 800 µm. The lengths of the communicating portions 30 in the front-rear direction are in a range of, e.g., not less than 10 µm, or preferably not less than 20 µm and, e.g., not more than 1000 µm, or preferably not more than 200 µm. The width of the connection portion 29 is in a range of, e.g., not less than 10 µm, or preferably not less than 20 µm and, e.g., not more than 1000 µm, or preferably not more than 200 µm. The inner diameter of the positioning mark 18 is in a range of, e.g., not less than 10 µm, or preferably not less than 20 µm and, e.g., not more than 2000 µm, or preferably not more than 1000 µm. The outer diameter of the positioning mark 18 is in a range of, e.g., not less than 20 µm, or preferably not less than 30 µm and, e.g., not more than 3000 µm, or preferably not more than 2000 µm. The thickness of the second conductive layer 32 is in a range of, e.g., not less than 1 µm, or preferably not less than 4 µm and, e.g., not more than 30 µm, or preferably not more than 20 µm.

Figure 7G:
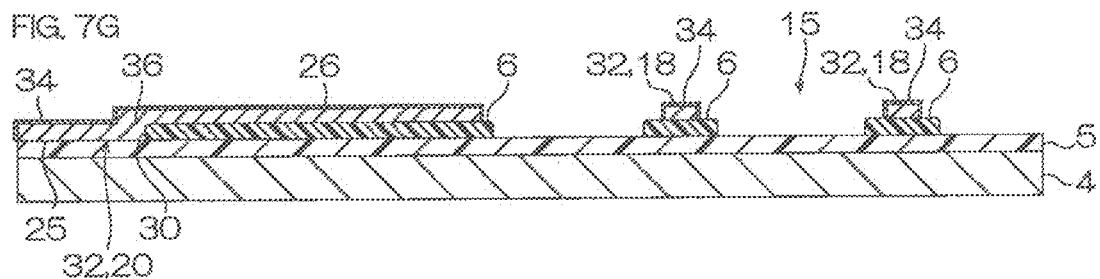

Next, in the method, as shown in FIGS. 7G and 8G, the second electroless plating layer 34 is provided so as to cover the top surface of the second conductive layer 32. Specifically, the respective top surfaces of the external-side terminals 24, the external wires 26, the communicating portions 30, and the head-side terminals 25 in the signal patterns 20 and the respective top surfaces of the connection portion 29 and the element-side terminal 22 in the power source pattern 19, and the positioning mark 18 are covered with the second electroless plating layer 34.

The second electroless plating layer 34 is provided by a known method such as, e.g., dipping the second conductive layer 32 into an electroless plating solution.

As the plating material of the second electroless plating layer 34, the same plating material as that of the first electroless plating layer 33 is used.

The thickness of the second electroless plating layer 34 is the same as the thickness of the first electroless plating layer 33.

Figure 7H:
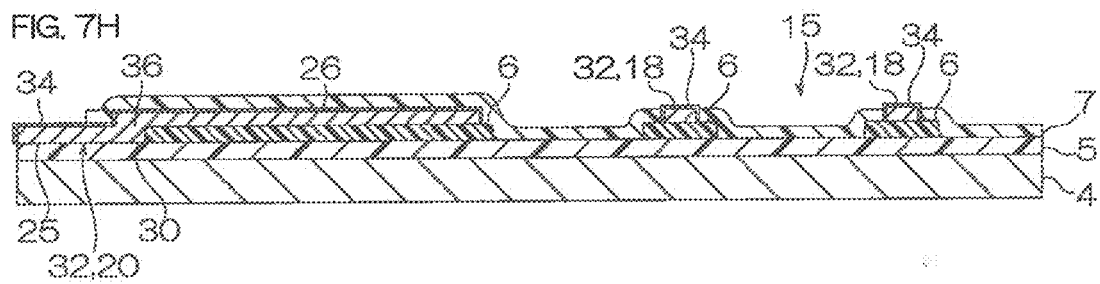

Next, in the method, as shown in FIGS. 7H and 8H, the insulating cover layer 7 is provided in the foregoing pattern over the intermediate insulating layer 6 and the insulating base layer 5 so as to cover the second electroless plating layer 34.

Specifically, the insulating cover layer 7 is formed so as to expose the second electroless plating layers 34 provided over the respective upper surfaces of the element-side terminal 22, the head-side terminals 25, the power-source-side terminal 21 (see FIG. 1), the external-side terminals 24 (see FIG. 1), and the positioning mark 18. Specifically, the insulating cover layer 7 is formed over the insulating base layer 5 and the intermediate insulating layer 6 so as to cover the second electroless plating layer 34 corresponding to the external wires 26 and the first electroless plating layer 33 corresponding to the power source wire 23.

As the insulating material of the insulating cover layer 7, the same insulating material as that of the insulating base layer 5 is used.

To provide the insulating cover layer 7, e.g., a solution (varnish) of a photosensitive synthetic resin is applied to the respective upper surfaces of the insulating base layer 5 and the intermediate insulating layer 6, dried, then exposed to light, developed, and cured as necessary. The formation of the insulating cover layer 7 is not limited to the method described above. For example, it is also possible to preliminarily form a synthetic resin into a film and stick the film to the respective upper surfaces of the insulating base layer 5 and the intermediate insulating layer 6 via a known adhesive layer.

The insulating cover layer 7 has a thickness in a range of, e.g., not less than, e.g., 1 µm, or preferably not less than 2 µm and, e.g., not more than 30 µm, or preferably not more than 10 µm.

Figure 7I:
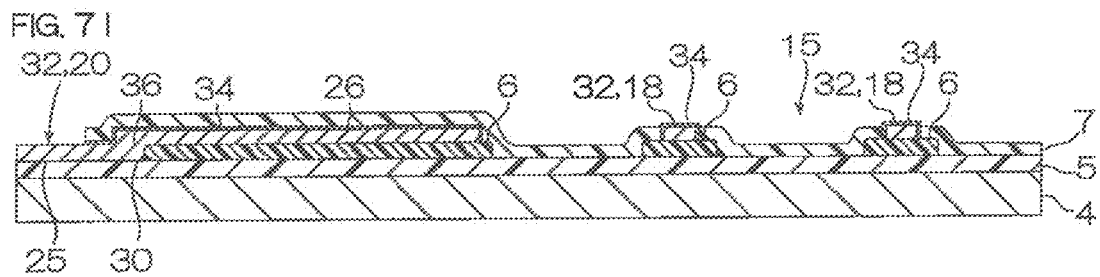

Next, in the method, as shown in FIGS. 7I and 8I, the second electroless plating layers 34 covering the respective top surfaces of the element-side terminal 22 and the head-side terminals 25 and the top surfaces of the external-side terminals 24 (see FIG. 1) are removed. At this time, the first electroless plating layer 33 covering the top surface of the power-source-side terminal 21 (see FIG. 1) is removed.

To remove the first and second electroless plating layers 33 and 34, a method such as, e.g., an etching method such as dry etching (e.g., plasma etching) or wet etching (e.g., chemical etching), drilling perforation, or laser processing is used. Preferably, wet etching is used. In the removal of the first and second electroless plating layers 33 and 34, conditions are set such that at least the second electroless plating layers 34 covering the respective top surfaces of the element-side terminal 22 and the head-side terminals 25 can completely be removed and the element-side terminal 22 and the head-side terminals 25 are not even partially removed.

Figure 7J:
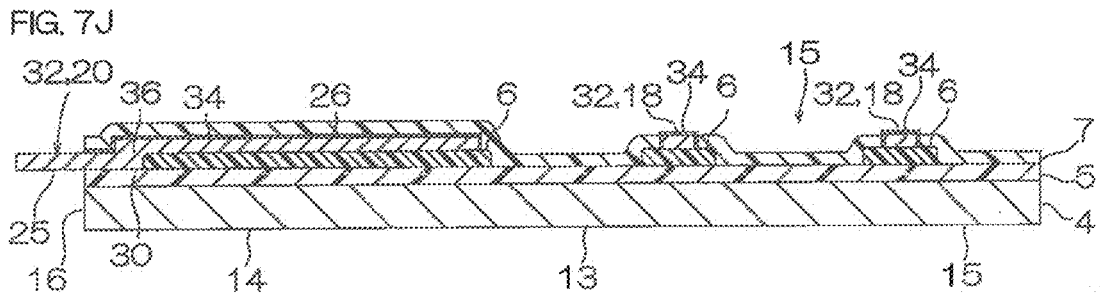

Next, in the method, as shown in FIGS. 7J and 8J, the terminal opening 16 and the slit 11 (see FIG. 1) are formed. Specifically, the respective portions of the metal supporting board 4 and the insulating base layer 5 which correspond to the terminal opening 16 and the slit 11 are successively removed. As a result, the respective lower surfaces of the element-side terminal 22 and the head-side terminals 25 are exposed.

To provide the terminal opening 16 and the slit 11, a method such as, e.g., an etching method such as dry etching (e.g., plasma etching) or wet etching (e.g., chemical etching), drilling perforation, or laser processing is used. Preferably, the terminal opening 16 and the slit 11 are formed by wet etching.

Figure 7K:
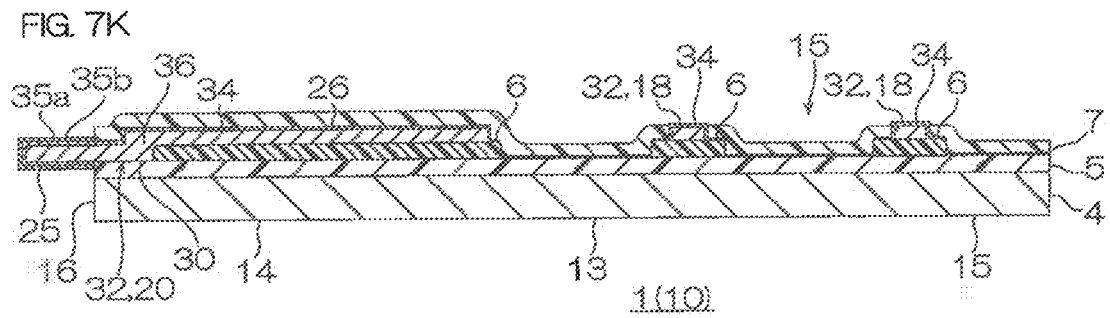

Next, in the method, as shown in FIGS. 7K and 8K, the electrolytic plating layer 35 is provided so as to cover the respective surfaces (upper, lower, and side surfaces) of the element-side terminal 22 and the head-side terminals 25 and the respective surfaces (upper surfaces) of the power-source-side terminal 21 and the external-side terminals 24 (see FIG. 1).

For example, the plurality of (two) electrolytic plating layers 35 are provided. That is, first, with the first electrolytic plating layer 35a, the respective top surfaces of the element-side terminal 22, the head-side terminals 25, the power-source-side terminal 21, and the external-side terminals 24 are covered. Then, with the second electroless plating layer 35b, the top surface of the first electrolytic plating layer 35a is covered.

The electrolytic plating layer 35 is provided by a known method such that, e.g., electricity is supplied to the second conductive layer 32 during dipping it into an electrolytic plating solution.

Examples of the plating material of the electrolytic plating layer 35 include a conductive protective material such as gold, chromium, nickel, or an alloy thereof. Specifically, for the first electrolytic plating layer 35a, nickel is used preferably. For the second electrolytic plating layer 35b, gold is used preferably.

The respective thicknesses of the first and second electrolytic plating layers 35a and 35b are in a range of, e.g., not less than 0.01 μm and, e.g., not more than 10 μm, or preferably not more than 5 μm.

Next, the metal supporting board 4 is trimmed as necessary, though not shown. At this time, the metal supporting board 4 grounded to the power source wire 23 is removed.

In this manner, the suspension board with circuit 1 is obtained.

Then, on the rear end portion of the main body portion 9 of the suspension board with circuit 1, the power source (not shown) and the external circuit board (not shown) are mounted and, as shown by the broken line in FIG. 1, the slider 2 and the light emitting element 3 are mounted on the tongue portion 14. Specifically, to the power-source-side terminal 21, the terminal of the power source is electrically connected and, to the external-side terminals 24, the terminals of the external circuit board (not shown) are electrically connected. Also, to the plurality of head-side terminals 25, the magnetic head of the slider 2 is electrically connected and, to the element-side terminal 22, the light emitting element 3 is electrically connected. Then, the suspension board with circuit 1 is mounted in a hard disk drive.

5. Function/Effect

In the suspension board with circuit 1, the second conductive layer 32 includes the element-side terminal 22 and the head-side terminals 25. Accordingly, as shown in FIGS. 5F and 6F, in the step of providing the second conductive layer 32, the element-side terminal 22 and the head-side terminals 25 can simultaneously be provided. This can improve the accuracy of the relative position of the element-side terminal 22 and the head-side terminals 25.

Also, in the suspension board with circuit 1, as shown in FIG. 3Y, the connecting end portion 28 is covered with the connection portion 29. Therefore, it is possible to reliably electrically connect the connection portion 29 and the connecting end portion 28. This can improve the reliability of connection between the connection portion 29 and the connecting end portion 28.

In the suspension board with circuit 1, as shown in FIGS. 4B and 4C, the power source wire 23 is covered with the first electroless plating layer 33. Accordingly, the power source wire 23 has excellent durability.

Also, in the suspension board with circuit 1, the external wires 26 are covered with the second electroless plating layer 34. Accordingly, each of the external wires 26 has excellent durability.

Also, in the suspension board with circuit 1, as shown in FIGS. 3X and 3Y, the element-side terminal 22 and the head-side terminals 25 are covered with the electrolytic plating layer 35. This can improve the reliability of connection between the element-side terminal 22 and the light emitting element 3 and the reliability of connection between the head-side terminals 25 and the slider 2.

Also, in the suspension board with circuit 1, the element-side terminal 22, the head-side terminals 25, and the positioning mark 18 are provided in the same second conductive layer 32. As a result, the accuracy of the relative position of the element-side terminal 22, the head-side terminals 25, and the positioning mark 18 is improved. Therefore, it is possible to accurately position the slider 2 and the light emitting element 3 relative to the suspension board with circuit 1 and improve the reliability of connection between the slider 2 and the head-side terminals 25 and the reliability of connection between the light emitting element 3 and the element-side terminal 22.

In the method of producing the suspension board with circuit 1, the second conductive layer 32 includes the element-side terminal 22 and the head-side terminals 25. As a result, as shown in FIGS. 5F and 6F, in the step of providing the second conductive layer 32, the element-side terminal 22 and the head-side terminals 25 can simultaneously be provided. This can improve the accuracy of the relative position of the element-side terminal 22 and the head-side terminals 25.

Also, in the method of producing the suspension board with circuit 1, as shown in FIG. 6D, the first electroless plating layer 33 covers the power source wire 23. This can improve the durability of the power source wire 23.

Also, in the method of producing the suspension board with circuit 1, as shown in FIGS. 7G and 8G the external wires 26 are covered with the second electroless plating layer 34. This can improve the durability of the external wires 26.

In the case of producing the suspension board with circuit 1 in which the element-side terminal 22 provided in the first conductive layer 31 and the head-side terminals 25 provided in the second conductive layer 32 are respectively formed over and under the intermediate insulating layer 6 as described in Japanese Unexamined Patent No. 2009-129490, the first conductive layer 31 including the element-side terminal 22 is covered with the first electroless plating layer 33, though not shown. Then, when the second conductive layer 32 including the head-side terminals 25 is covered with the second electroless plating layer 34, the first electroless plating layer 33 corresponding to the element-side terminal 22 is exposed. Accordingly, the second electroless plating layer 34 is provided so as to cover the first electroless plating layer 33 corresponding to the element-side terminal 22. That is, in the element-side terminal 22, the first and second electroless plating layers 33 and 34 corresponding thereto, i.e., the two electroless plating layers 33 and 34 are formed relatively thick. To cover the element-side terminal 22 with the electrolytic plating layer 35, the two electroless plating layers 33 and 34 need to be removed first. If it is attempted to remove the two electroless plating layers 33 and 34 by etching or the like, the two electroless plating layers 33 and 34 cannot entirely be removed or can entirely be removed, but the element-side terminal 22 may unintentionally be partially removed. This causes the problem that the element-side terminal 22 cannot reliably be formed to have intended dimensions.

By contrast, in accordance with the method of producing the suspension board with circuit 1 in the present embodiment, after the step of covering the first conductive layer 31 with the first electroless plating layer 33 (see FIG. 6D), in the step of providing the second conductive layer 32 (see FIG. 6F), the element-side terminal 22 is provided. As a result, in the step of providing the second electroless plating layer 34 (see FIG. 8G), the element-side terminal 22 is not covered with the first electroless plating layer 33, but is covered only with the second electroless plating layer 34. Consequently, the element-side terminal 22 and the head-side terminals 25 are covered with the same single second electroless plating layer. This allows the second electroless plating layer 34 covering the element-side terminal 22 and the second electroless plating layer 34 covering each of the head-side terminals 25 to be formed to have the same relatively small thickness. Therefore, it is possible to reliably remove the second electroless plating layer 34 corresponding to the element-side terminal 22 and the second electroless plating layer 34 corresponding to each of the head-side terminals 24, i.e., the second electroless plating layers 34 respectively corresponding to the element-side terminal 22 and the head-side terminals 25, while successfully suppressing unintended partial removal of the element-side terminal 22. This allows the element-side terminal 22 to be reliably formed to have intended dimensions. As a result, it is possible to improve the accuracy of the dimensions of the element-side terminal 22 and the head-side terminals 25.

Also, in accordance with the method of producing the suspension board with circuit 1, the element-side terminal 22 and the head-side terminals 25 are covered with the electrolytic plating layer 35. This can improve the reliability of connection to the element-side terminal 22 and the head-side terminals 25.

It is also possible to mention a method of producing a suspension board with circuit which is different from the suspension board with circuit 1 in the foregoing embodiment and in which the first and second conductive layers 31 and 32 are formed in the pattern reverse to the foregoing pattern. That is, in the suspension board with circuit, the second conductive layer 32 includes parts (the power-source-side terminal 21 and the power source wire 23) of the power source pattern 19, and the first conductive layer 31 includes the signal patterns 20 (the external-side terminals 24, the external wires 26, the communicating portions 30, and the head-side terminals 25) and the remaining parts (the connection portion 29 and the element-side terminal 22) of the power source pattern 19.

However, in the manufacturing method mentioned above, over the top surface of each of the element-side terminal 22 and the head-side terminals 25, the first and second electroless plating layers 33 and 34 are provided. As a result, the first and second double electroless plating layers 33 and 34 having a relatively large total thickness need to be removed. This degrades the accuracy of the dimensions of the light-emitting-element terminal 22 and the slider terminals 25.

Also, in the method of producing the suspension board with circuit mentioned above, a problem arises in that the time required to form the first electroless plating layer 33 increases. That is, the connection portion 29 and the element-side terminal 22 are formed (each in the form of a floating island) to be independent of and isolated from the surrounding conductive layers. As a result, it becomes difficult for each of the connection portion 29 and the element-side terminal 22 to conduct electricity (be grounded) to the metal supporting board 4. Accordingly, it takes a long time to cover each of the connection portion 29 and the element-side terminal 22 (particularly the connection portion 29) with the first electroless plating layer 33. This causes a problem in that production efficiency deteriorates or the connection portion 29 cannot reliably be covered with the first electroless plating layer 33.

By contrast, in the suspension board with circuit 1 in the present embodiment, the connection portion 29 and the element-side terminal 22 are provided in the second conductive layer 32. This allows the problem described above to be solved. That is, it is sufficient to remove only the relatively thin second electroless plating layer 34 having a single-layer configuration from the top surface of the element-side terminal 22. As a result, it is possible to improve the accuracy of the dimensions of the light-emitting-element terminal 22 and the slider terminals 25.

Also, in the suspension board with circuit 1 in the present embodiment, the connection portion 29 is not independent, i.e., is electrically connected to the power source wire 23 (power source wire 23 grounded to the metal supporting board 4). This allows the top surface of the connection portion 29 to be reliably covered with the second electroless plating layer 34 in a short period of time.

6. Modification

A modification of the suspension board with circuit is described with reference to FIGS. 9 and 10. Note that, in the modification, the same members as in the embodiment described above are designated by the same reference numerals and a description thereof is omitted.

In the embodiment described above, as shown in FIG. 3Y, the connecting end portion 28 is covered with the connection portion 29 via the first electroless plating layer 33. However, it is also possible to provide an opening 38 in the intermediate insulating layer 6, fill the opening 38 exposing the connecting end portion 28 with a conduction portion 39, and provide electrical connection to the connecting end portion 28 using the conduction portion 39 via the first electroless plating layer 33.

Figure 9:
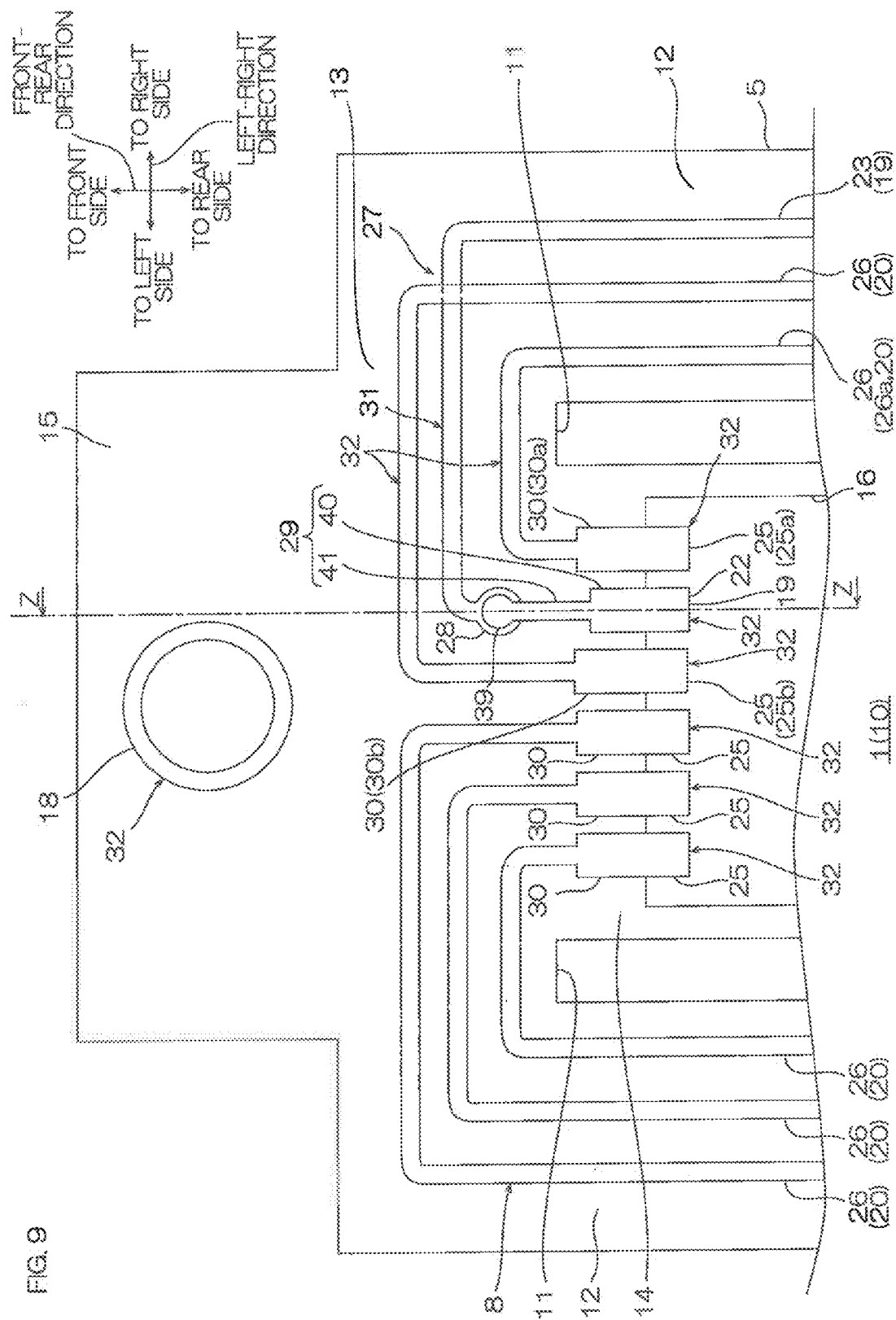
FIG. 9 shows a modification (form including a conduction portion) of the suspension board with circuit shown in FIG. 2.

As shown in FIG. 9, the connecting end portion 28 is formed in a generally circular shape in plan view.

Figure 10:
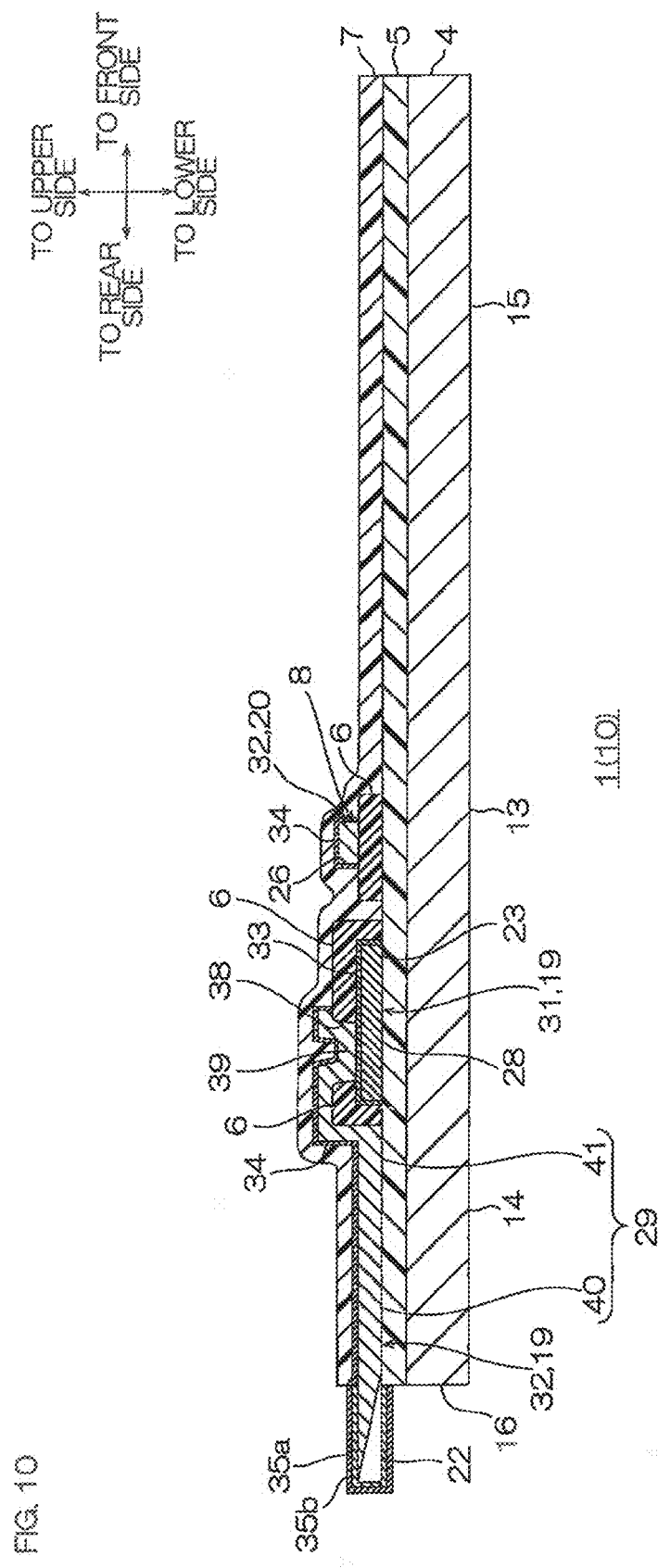
FIG. 10 shows a front cross-sectional view of the suspension board with circuit along the line Z-Z shown in FIG. 9.

As shown in FIG. 10, in the intermediate insulating layer 6, the opening 38 exposing the center portion of the first electroless plating layer 33 covering the upper surface of the connecting end portion 28 is provided. The opening 38 is formed so as to extend through the intermediate insulating layer 6 in the thickness direction thereof.

As shown in FIG. 9, the connection portion 29 integrally includes a wider portion 40 formed in the rear end portion of the connection portion 29 and a narrower portion 41 extending from the front end edge of the wider portion 40 to the front side.

On the insulating base layer 5, the wider portion 40 is formed to have the same shape as that of the connection portion 29 in the embodiment shown in FIG. 2 in plan view.

The narrower portion 41 is formed to extend from the middle portion of the front end edge of the wider portion 40 to the front side. As shown in FIG. 10, the rear end portion of the narrower portion 41 is formed on the upper surface of the insulating base layer 5. The middle portion of the narrower portion 41 in the front-rear direction is formed on the rear surface of the intermediate insulating layer 6 covering the rear end portion of the connecting end portion 28. The front end portion of the narrower portion 41 is formed on the upper surface of the intermediate insulating layer 6. That is, the narrower portion 41 is continuously formed over the upper surface of the insulating base layer 5 and the rear and upper surfaces of the intermediate insulating layer 6. The front end portion of the narrower portion 41 has a generally circular shape in plan view. The narrower portion 41 includes the conduction portion 39 at the middle portion of the front end portion thereof.

The conduction portion 39 is formed to extend downward from the surrounding narrower portion 41, specifically to be embedded in and fill the opening 38. The conduction portion 39 is formed in the opening 38 so as to come in contact with the upper surface of the first electroless plating layer 33 exposed from the opening 38. Note that the conduction portion 39 is located on the front side of the element-side terminal 22 to be spaced apart therefrom.

In the suspension board with circuit 1, the conductive portion 38 embedded in the opening 38 of the intermediate insulating layer 6 electrically connects the connecting end portion 28 to the power source wire 23 via the first electroless plating layer 33. This allows the connection portion 29 to be placed in the tongue portion 14 as the region where the power source wire 23 and the external wires 26 are provided at a high density.

Also, in the suspension board with circuit 1, the conduction portion 39 is provided to be spaced apart from the element-side terminal 22. Accordingly, when the light emitting element 3 (see the broken line in FIG. 1) is solder-bonded to the element-side terminal 22, heat conduction from heat resulting from soldering to the conduction portion 39 can be suppressed. Therefore, it is possible to suppress the deterioration of the reliability of connection between the conduction portion 39 and the power source wire 23 resulting from solder bonding and further suppress the formation of a void in the conduction portion 39 resulting from solder bonding.

In the description given above, the suspension board with circuit 1 is shown as an example of the wired circuit board of the present invention. However, the wired circuit board of the present invention is not limited thereto and can also be configured as, e.g., a flexible wired circuit board not including the metal supporting board 4 or a flexible wired circuit board including the metal supporting board 4 as a reinforcing layer.

Also, in the description given above, the light emitting element 3 used for thermally-assisted recording is shown as an example of the component to be mounted. However, the component to be mounted is not limited thereto. For instance, a piezoelectric element (piezo-element) for accurately and finely adjusting the position and angle of the slider 2 in the gimbal portion 10 can also be shown as an example of the component to be mounted. Instead of the power source and the light emitting element 3, an external component and an external circuit board can also be shown by way of example. In that case, the power source pattern 19 is replaced with a second signal pattern 19, the power-source-side terminal 21 is replaced with a second external-side terminal 22, the element-side terminal 22 is replaced with a third external-side terminal 22, and the power source wire 23 is replaced with a second signal wire 23.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A wired circuit board, comprising:
a first insulating layer;
a first conductive layer including a first wire directly disposed on an upper surface of the first insulating layer;
a second insulating layer directly disposed on the upper surface of the first insulating layer so as to cover the first wire; and
a second conductive layer including a second wire directly disposed on an upper surface of the second insulating layer, wherein the second conductive layer includes:
a first terminal portion for electrically connecting the first wire to an outside; a second terminal portion for electrically connecting the second wire to an outside; and a connection portion electrically connecting the first terminal portion and the first wire, wherein the first terminal portion and the second terminal portion are disposed side by side on the upper surface of the first insulating layer,
wherein the second conductive layer further includes a positioning mark for positioning a component to be mounted relative to the wired circuit board,
and wherein the positioning mark has a generally annular shape in a plan view.

2. A wired circuit board according to claim 1, wherein the first conductive layer includes a connecting end portion provided in the first wire, and
the connecting end portion is covered with the connection portion.

3. A wired circuit board according to claim 2, wherein the connection portion is generally U-shaped in a front cross-sectional view and opens downward so as to surround the connecting end portion.

4. A wired circuit board according to claim 1, wherein the second insulating layer is formed with an opening exposing the first conductive layer, and
the connection portion includes a conduction portion embedded in the opening to be electrically connected to the first wire.

5. A wired circuit board according to claim 4, wherein the conduction portion is provided to be spaced apart from the first terminal portion.

6. A wired circuit board according to claim 1, further comprising:
a first electroless plating layer covering the first wire.

7. A wired circuit board according to claim 1, further comprising:
a second electroless plating layer covering the second wire.

8. A wired circuit board according to claim 1, further comprising:
an electrolytic plating layer covering the first and second terminal portions.

9. A wired circuit board according to claim 1, wherein the connection portion is generally Z-shaped in a side cross-sectional view.

* * * * *